(12) United States Patent
Degoirat

(10) Patent No.: US 8,183,926 B2
(45) Date of Patent: May 22, 2012

(54) ELECTRONIC CIRCUIT OUTPUT STAGE

(75) Inventor: Hubert Degoirat, Villard Bonnot (FR)

(73) Assignee: STMicroelectronics (Crolles2) SAS, Crolles (FR)

( * ) Notice: Subject to any disclaimer, the term of this patent is extended or adjusted under 35 U.S.C. 154(b) by 0 days.

(21) Appl. No.: 13/048,623

(22) Filed: Mar. 15, 2011

(65) Prior Publication Data

US 2011/0227653 A1 Sep. 22, 2011

(30) Foreign Application Priority Data

Mar. 16, 2010 (FR) ...................................... 10 51859

(51) Int. Cl.
*H03F 3/04* (2006.01)
(52) U.S. Cl. ........................................ 330/288; 323/315
(58) Field of Classification Search .................. 330/288; 323/315, 316
See application file for complete search history.

(56) References Cited

U.S. PATENT DOCUMENTS

| | | | |
|---|---|---|---|
| 4,045,747 A | 8/1977 | Hsu | |
| 5,446,397 A * | 8/1995 | Yotsuyanagi | 327/66 |
| 5,644,269 A * | 7/1997 | Wong et al. | 330/261 |
| 6,198,343 B1 * | 3/2001 | Matsuoka | 327/543 |
| 6,297,672 B1 | 10/2001 | Okayasu | |
| 6,587,000 B2 * | 7/2003 | Oikawa | 330/288 |
| 7,999,619 B2 * | 8/2011 | Draxelmayr | 330/288 |

OTHER PUBLICATIONS

Republique Francaise, Institut National De La Propriete Industrielle, Rapport de Recherche Preliminaire (Preliminary Search Report) issued on Jul. 13, 2010 in French Patent Application No. 10-51859 (2 pages).

* cited by examiner

*Primary Examiner* — Henry Choe
(74) *Attorney, Agent, or Firm* — Slater & Matsil, L.L.P.

(57) ABSTRACT

An electronic circuit including: a first branch, placed between two terminals of application of a D.C. voltage, including a series connection of a first constant current source, of a first diode-connected N-channel MOS transistor, of a first diode-connected P-channel MOS transistor, and of a second constant current source; a second branch, parallel to the first branch, comprising a series connection of a second N-channel MOS transistor connected as a current mirror on the first N-channel MOS transistor and of a second P-channel MOS transistor connected as a current mirror on the first P-channel transistor; and an input terminal connected between the first N-channel and P-channel transistors and an output terminal connected between the second N-channel and P-channel transistors.

19 Claims, 2 Drawing Sheets

ELECTRONIC CIRCUIT OUTPUT STAGE

This application claims the priority benefit of French Patent Application Number FR-10/51859, filed on Mar. 16, 2010, entitled "Electronic Circuit Output Stage," which is hereby incorporated by reference to the maximum extent allowable by law.

TECHNICAL FIELD

The present invention relates to an electronic circuit output stage. The present invention also relates to an application of such an output stage to the forming of a voltage division circuit.

BACKGROUND

Output stages of electronic circuits, and especially of amplification circuits, conventionally have a low output impedance. This distinguishes an output stage from the stages of preceding ranks of the circuits, which may have high-impedance outputs. Such an output stage enables providing a load coupled at the circuit output with a fixed voltage and a current adapted to the power consumption of the load. Similar circuits may be used to form voltage division circuits.

FIG. 1 illustrates a circuit 10 behaving as a voltage divider. Circuit 10 comprises a first branch coupled between two terminals Vdd and GND across which is applied a D.C. power supply voltage, terminal GND being a ground terminal. The first branch comprises a series connection, from terminal Vdd, of a resistor Ra1, of an N-channel MOS transistor Na1, of a P-channel MOS transistor Pa1, and of a resistor Ra2. Transistors Na1 and Pa1 are diode-connected, that is, the gate and the drain of transistor Na1 are interconnected, and the gate and the drain of transistor Pa1 are interconnected. The first branch forms a voltage division circuit, also commonly referred to as a voltage divider.

A second branch comprising a series connection, between terminals Vdd and GND, of a transistor Na2 connected to form a current mirror with transistor Na1, that is, where the gates of transistors Na1 and Na2 are interconnected, and of a transistor Pa2 connected to form a current mirror with transistor Na2, is placed in parallel with the first branch. An output terminal OUTa of the circuit corresponds to the connection node between transistors Na2 and Pa2. A load, a capacitor Ca in the example of FIG. 1, is coupled between output terminal OUTa and ground GND.

Circuit 10 operates as follows. In the first branch, the voltage at a node Aa located between transistors Na1 and Pa1 is substantially equal to a ratio $(Ra2 \times Vdd)/(Ra1+Ra2)$, to within the threshold voltage differences between transistors Na1 and Pa1. The current mirrors enable the current flowing in the first branch to be present in the second branch, proportionally to the ratio between terms W/L of the mirror transistors, W and L respectively being the width and the length of the considered transistor, and also enable the voltage on output OUTa to be substantially the same as that at node Aa.

When the load consumes power, a current proportional to this power consumption is provided thereto by the second circuit branch. This circuit operates properly as long as voltage Vdd is greater than the sum of the threshold voltages of transistors Na1 and Pa1.

A disadvantage of the circuit of FIG. 1 appears when this circuit is used with a so-called low power supply voltage Vdd. This situation is more and more frequent. Indeed, it is currently desirable to form circuits consuming less and less power. To achieve this, a solution comprises powering the circuits by means of so-called low power supply voltages. This is possible since electronic components also require less and less power to operate properly. However, the threshold voltages of MOS transistors is decreasing as technology advances, but not as fast as the decrease in circuit power supply voltages.

Thus, when the power supply voltage is decreased, the current in the first branch decreases but the voltage drop across transistors Na1 and Pa1 remains substantially constant. A problem is posed when the power supply voltage reaches a value only slightly greater than the sum of the threshold voltages of transistors Na1 and Pa1. In this case, the current flowing in the first branch, and thus in the second branch of the circuit, decreases and may not be sufficient to power load Ca.

Further, although N-channel MOS transistors having identical characteristics and P-channel MOS transistors having identical characteristics can now be formed on a same circuit, deviations still appear from one circuit to another between MOS transistors of the same type. If voltage Vdd is decreased, the current in the first circuit branch may vary according to the threshold voltages of transistors Na1 and Pa1, from one circuit to another.

To check whether a circuit such as that in FIG. 1 operates properly, simulations are performed by forcing the threshold voltages of the circuit transistors to extreme values. Such simulations enable testing the most unfavorable cases, especially when transistors Na1 and Pa1 have significant threshold voltages (slow transistors). In this case, the current in each of the circuit branches can become close to zero.

To increase the current, one could decrease the value of resistors Ra1 and Ra2. However, in this case, the threshold voltage variations of transistors Na1 and Pa1 strongly influence the current value in the circuit. Further, the decrease in the value of resistors Ra1 and Ra2 increases the power dissipation in these resistors, and thus the power consumption of the circuits.

Finally, due to deviation in MOS transistor threshold voltages, the output voltage may slightly vary between different circuits formed as in FIG. 1. Indeed, between extreme cases where transistors Na1/Na2 have a significant threshold voltage and where transistors Pa1/Pa2 have a low threshold voltage, and conversely, voltage OUT varies around value $(Ra2 \times Vdd)/(Ra1+Ra2)$ since the voltage at node Aa varies.

SUMMARY OF THE INVENTION

An advantageous feature of an embodiment of the present invention is to provide an electronic circuit output stage overcoming all or part of the above-mentioned disadvantages.

Another advantageous feature of an embodiment of the present invention is to provide a voltage division circuit, capable of being powered with a low voltage and little sensitivity to the threshold variation of the MOS transistors forming it.

Thus, an embodiment of the present invention provides an output stage of an electronic circuit comprising: a first branch, coupled between first and second terminals across which is applied a D.C. voltage, comprising a series connection of a first N-channel MOS transistor and a first P-channel MOS transistor, the node between the first N-channel and P-channel MOS transistors being connected to an input terminal, the first N-channel MOS transistor being coupled to the first terminal by a first constant current source, the first P-channel MOS transistor being coupled to the second terminal by a second constant current source, the first N-channel and P-channel MOS transistors being diode-connected; a second branch, parallel to the first branch, comprising a series connection of a second N-channel MOS transistor connected to form a current mirror with the first N-channel MOS transistor and of a second P-channel MOS transistor connected to form a current mirror with the first P-channel transistor; and an output terminal connected between the second N-channel and P-channel transistors.

According to an embodiment of the present invention, the first and second current sources are respectively formed of first and of a second circuits of a current mirror type.

An embodiment of the present invention further provides a voltage division circuit, comprising a circuit such as described hereabove, the input terminal of said circuit receiving a voltage proportional to a power supply voltage.

The foregoing objects, features, and advantages of the present invention will be discussed in detail in the following non-limiting description of specific embodiments in connection with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
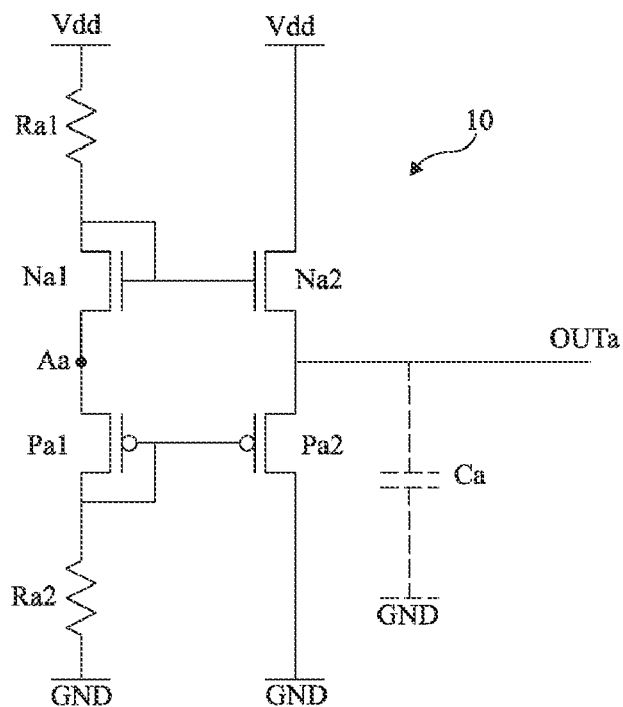
FIG. 1 illustrates a voltage division circuit.

For clarity, the same elements have been designated with the same reference numerals in the different drawings.

To overcome the disadvantages of voltage division circuits such as that in FIG. 1, a circuit in which the voltage division bridge is formed in a different branch than the branch comprising the current mirror transistors is provided.

Figure 2:
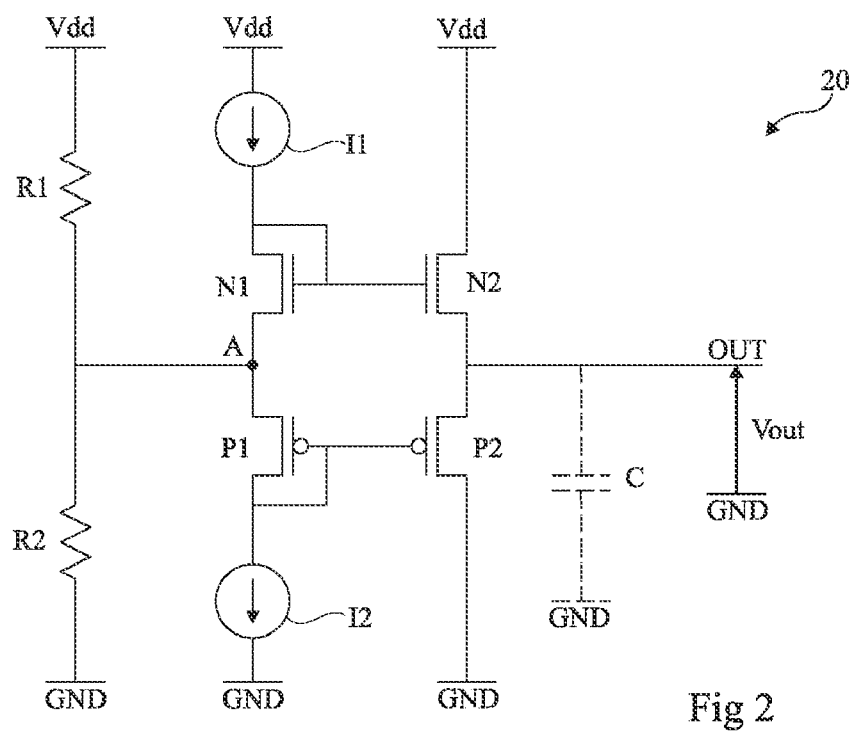
FIG. 2 illustrates a voltage division circuit according to an embodiment of the present invention.

FIG. 2 illustrates a voltage division circuit 20. This circuit comprises three parallel branches between two terminals of application of a power supply voltage, in the example of FIG. 2, a first terminal on which a D.C. voltage Vdd is applied and a second terminal coupled to ground GND.

A first branch of the circuit comprises a series connection of two resistors R1 and R2 forming a voltage division bridge, sometimes referred to as a voltage divider. The common terminal between resistors R1 and R2 is connected to a node A of a second branch, between an N-channel MOS transistor N1 and a P-channel MOS transistor P1. The second main terminal of transistor N1 is coupled to a first terminal of a first constant current source I1 having its second terminal coupled to terminal Vdd. Transistor N1 is diode-connected (gate connected to the drain).

The second terminal of transistor P1 is coupled to a first terminal of a second constant current source I2 having its second terminal coupled to ground GND. Transistor P1 is diode-connected (gate connected to the drain). A third branch of the circuit comprises, between terminals Vdd and GND, a series connection of an N-channel MOS transistor N2 and of a P-channel MOS transistor P2. The gate of transistor N2, and respectively P2, is connected to the gate of transistor N1, and respectively P1 (current mirrors).

An output terminal of the circuit, OUT, having a voltage at a value Vout, is connected to the common terminal of transistors N2 and P2. A load, in the shown example, a capacitor C, is coupled at the circuit output. It should be noted that this load example is not limiting.

Preferably, constant current sources I1 and I2 provide constant currents of same intensity or of substantially identical intensities, within the limits of manufacturing processes and controls. The current in transistors N1 and P1 is thus set to a same value, which imposes a zero current between the first and second branches of circuit 20. The voltage at node A is proportional to Vdd due to the voltage division bridge of the first branch. Advantageously, constant current sources I1 and I2 are independent of the circuit. Thus, the current in the first branch has a value which does not change as a function of the input voltage, or as a function of the characteristics of the component of the first branch.

Circuit 20 advantageously enables one to decrease power supply voltage Vdd to a minimum, that is, to the sum of the maximum threshold voltages of transistors N1 and P1 (taking into account the threshold voltage deviations of the transistors formed on a same semiconductor wafer), while providing a constant current in the third branch, capable of being used by load C. Indeed, by imposing a constant current in the second branch, the low current and current variation issues of prior art are done away with.

Figure 3:
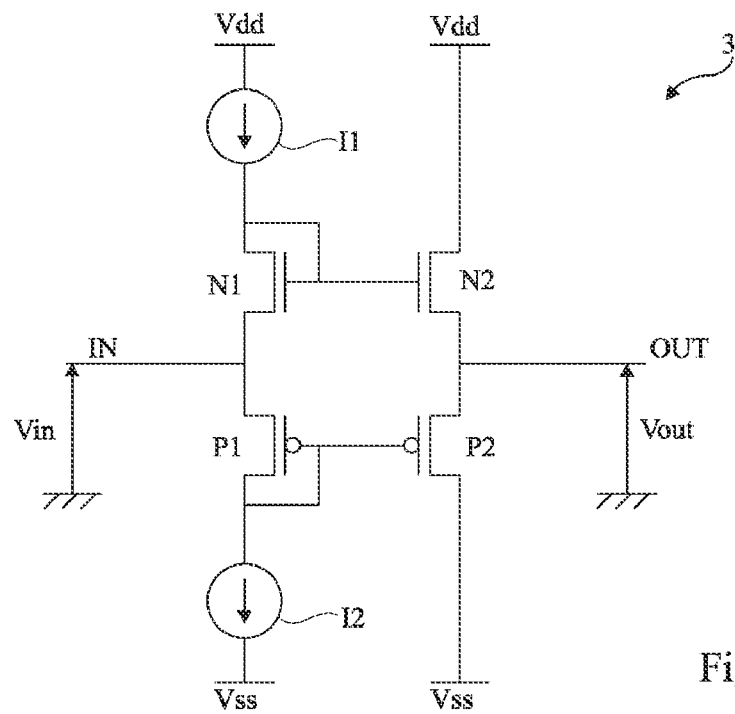
FIG. 3 illustrates an output stage of an electronic circuit according to an embodiment of the present invention.

Further, the circuit of FIG. 3 avoids the problem of fluctuations of voltage Vout according to the threshold voltages between MOS transistors since the voltage at node A, which is "copied" on the circuit output, remains fixed and proportional to voltage Vdd (according to ratio R2/(R1+R2)).

FIG. 3 illustrates a circuit 30 showing a generalization of circuit 20 in forming of an electronic circuit output stage, for example, of an amplification circuit, having a low output impedance. This circuit may especially form an output stage of a class-AB amplifier.

Circuit 30 comprises two parallel branches placed between two terminals Vdd and Vss of application of a D.C. voltage Vdd–Vss. The first branch of the circuit comprises a series connection of a first constant current source I1, of an N-channel transistor N1, of a P-channel transistor P1, and of a second constant current source I2. The gate of transistor N1 is connected to its drain and the gate of transistor P1 is connected to its drain. An input terminal of the circuit, IN, intended to receive an input voltage Vin, is connected to the connection node between transistors N1 and P1.

The second branch of circuit 30 comprises a series connection of an N-channel transistor N2 and of a P-channel transistor P2, respectively connected as current mirrors on transistors N1 and P1. The connection node between transistors N2 and P2 forms output terminal OUT of the circuit, which provides an output voltage Vout.

The output stage of electronic circuit 30 enables one to take maximum advantage of voltage Vdd–Vss by limiting power losses, while avoiding variations of the output voltage linked to MOS transistor threshold voltage variations from one circuit to another. Further, this output stage enables one to properly power a load placed at the circuit output.

The use of two constant current sources having a current value independent of the characteristics of the components of the first branch and of the input voltage ensures that the input current stays close to zero.

Figure 4:
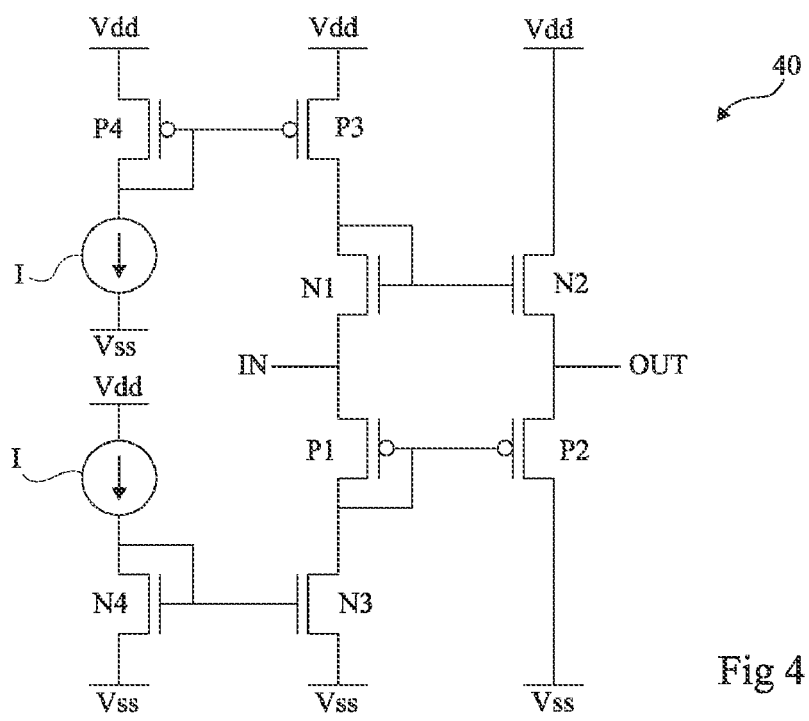
FIG. 4 illustrates a variation of the circuit of FIG. 3.

FIG. 4 illustrates a possible structure enabling one to obtain the operation of circuit 30. This drawing shows a circuit 40 illustrating an example of a circuit forming constant current sources I1 and I2 of circuit 30. In this circuit, constant current source I1 comprises a P-channel transistor P3 placed between the terminal of application of voltage Vdd and transistor N1. Transistor P3 is connected to form a current mirror with a P-channel transistor P4 having a first terminal coupled to the terminal of application of voltage Vdd. The gate of transistor P4 is connected to the second terminal of transistor P4 and to a first terminal of a constant current source I, which has its second terminal coupled to a voltage source Vss, or to a voltage source of another value than Vss.

Current source I2 comprises an N-channel transistor N3 placed between the terminal of application of voltage Vss and transistor P1. Transistor N3 is connected to form a current mirror with an N-channel transistor N4 having a first terminal coupled to the terminal of application of voltage Vss. The gate of transistor N4 is connected to the second terminal of transistor N4 and to a first terminal of a constant current source I having its second terminal coupled to a voltage source Vdd, or to a voltage source of another value. It should be noted that the current sources coupled with transistors P4 and N4 may actually be a same source, by forming a double current mirror with transistors N4 and P4.

Conventionally, in electronic circuits such as operational amplifiers, current sources are generally provided, especially for the biasing of differential pairs. Thus, the use of one or of two additional current sources for the forming of the circuit output stage poses no practical manufacturing problem.

Specific embodiments of the present invention have been described. Various alterations and modifications will occur to those skilled in the art. In particular, it should be noted that D.C. current sources I1 and I2 of FIGS. 2 and 3 may be formed by any circuit known by those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An output stage of an electronic circuit comprising:
a first branch, coupled between first and second terminals across which is applied a D.C. voltage, comprising a series connection of a first N-channel MOS transistor and a first P-channel MOS transistor, the node between the first N-channel and P-channel MOS transistors being connected to an input terminal, the first N-channel MOS transistor being coupled to the first terminal by a first constant current source, the first P-channel MOS transistor being coupled to the second terminal by a second constant current source, the first N-channel and P-channel MOS transistors being diode-connected;
a second branch, parallel to the first branch, comprising a series connection of a second N-channel MOS transistor connected to form a current mirror with the first N-channel MOS transistor and of a second P-channel MOS transistor connected to form a current mirror with the first P-channel transistor; and
an output terminal connected between the second N-channel and P-channel transistors.

2. The electronic circuit of claim 1, wherein the first and second current sources are respectively formed of a first and a second circuit of current mirror type.

3. The electronic circuit of claim 1, wherein the current flowing through the second branch is proportionate to a current flowing through the first branch first by a ratio defined by the proportionate width and length of the respective first and second N-channel transistors and respective first and second P-channel transistors.

4. The electronic circuit of claim 1, wherein a voltage on the output terminal is proportionate to a voltage on the input terminal.

5. An electronic circuit, comprising:
an input terminal configured to receive a voltage proportional to a power supply voltage;
a first constant current source having a first terminal connected to a first voltage source node and a second terminal connected to a first source/drain terminal of a first MOS transistor;
the first MOS transistor having its gate terminal tied to its first source/drain terminal and having its second source/drain terminal connected to a first source/drain terminal of a second MOS transistor and to the input terminal;
the second MOS transistor having its second source/drain terminal connected to a first terminal of a second constant current source, and having its gate terminal connected its second source/drain terminal;
the second constant current source having its second terminal connected to a second voltage source node;
a third MOS transistor having its first source/drain terminal connected to the first voltage source node and its second source/drain connected to a fourth MOS transistor, the gate terminal of the third MOS being connected to the gate terminal of the first MOS transistor;
the fourth MOS transistor having its gate terminal connected to the gate terminal of the second MOS transistor and having its second source/drain terminal connected to the second voltage source node; and
an output terminal connected between the third and fourth MOS transistors.

6. The electronic circuit of claim 5, wherein the second voltage source node is ground.

7. The electronic circuit of claim 6, wherein the first and third MOS transistor are NMOS transistors and the second and fourth MOS transistors are PMOS transistors.

8. The electronic circuit of claim 6, wherein the first constant current source comprises a fifth MOS transistor and the second constant current source comprises a sixth MOS transistor.

9. The electronic circuit of claim 8, further comprising:
a seventh MOS transistor having its first source/drain terminal connected to the first voltage source node, its gate terminal connected to the gate of the fifth MOS transistor, and its second source/drain terminal connected to a first terminal of a third constant current source;
the third constant current source having its second terminal connected to the second voltage source node;
a fourth constant current source having a first terminal connected to the first voltage source node, and a second terminal connected to an eighth MOS transistor; and
the eighth MOS transistor having its gate terminal connected to its first source/drain terminal and to the gate terminal of the second MOS transistor, and its second source/drain terminal connected to the second voltage source node.

10. The electronic circuit of claim 9, wherein the fifth and seventh MOS transistors are PMOS and the sixth and eighth MOS transistors are NMOS.

11. The electronic circuit of claim 10, wherein the second voltage source node is ground.

12. The electronic circuit of claim 6, further comprising a load connected to the output terminal.

13. An amplifier output stage comprising:
a first branch connected across a power supply and including a first constant current source series connected to a first diode-connected NMOS transistor, which is in turn series connected to a first diode-connected PMOS transistor, which is in turn series connected to a second constant current source;

a second branch in parallel to the first branch and including a second NMOS transistor having its gate terminal tied to the gate terminal of the first NMOS transistor series connected to a second PMOS transistor having its gate terminal tied to the gate terminal of the first PMOS transistor;

an input terminal tied to a common node of the first NMOS transistor and the first PMOS transistor; and an output terminal tied to a common node of the second NMOS transistor and the second PMOS transistor.

14. The amplifier output stage of claim 13, wherein the first second constant current source provide a substantially identical current.

15. The amplifier output stage of claim 14, wherein the second NMOS transistor is configured as a current mirror to the first NMOS transistor.

16. The amplifier output stage of claim 14, wherein the second PMOS transistor is configured as a current mirror to the first PMOS transistor.

17. The amplifier output stage of claim 14, wherein the power supply supplies a voltage that only slightly exceeds the sum of a threshold voltage of the first NMOS transistor plus a threshold voltage of the first PMOS transistor.

18. The amplifier stage of claim 14, wherein the first constant current source is a third PMOS transistor configured as a current mirror to a fourth PMOS transistor and the second constant current source is a third NMOS transistor configured as a current mirror to a fourth NMOS transistor.

19. The amplifier stage of claim 14, wherein a current through the fourth PMOS transistor is sourced through a second third constant current source.

* * * * *